(12) United States Patent
Tetreault et al.

(10) Patent No.: US 9,351,413 B2
(45) Date of Patent: May 24, 2016

(54) ELECTRICAL DEVICE POWERED THROUGH NEUTRAL OR GROUND

(71) Applicant: ABL IP Holding LLC, Conyers, GA (US)

(72) Inventors: Michael Tetreault, Brook, CT (US); Adam Lydecker, Meriden, CT (US); David M. Behnke, Middletown, CT (US); Stephen Haight Lydecker, Snellville, GA (US); Benjamin C. Hahn, Middletown, CT (US)

(73) Assignee: ABL IP Holding LLC, Decatur, GA (US)

( * ) Notice: Subject to any disclaimer, the term of this patent is extended or adjusted under 35 U.S.C. 154(b) by 572 days.

(21) Appl. No.: 13/775,482

(22) Filed: Feb. 25, 2013

(65) Prior Publication Data

US 2013/0220661 A1    Aug. 29, 2013

(51) Int. Cl.
| | |
|---|---|
| *H05K 13/00* | (2006.01) |
| *H05K 5/02* | (2006.01) |
| *H01R 4/64* | (2006.01) |
| *H01R 29/00* | (2006.01) |
| *H01R 31/08* | (2006.01) |

(52) U.S. Cl.
CPC ............... *H05K 5/0247* (2013.01); *H01R 4/64* (2013.01); *H01R 29/00* (2013.01); *H01R 31/08* (2013.01); *H05K 13/00* (2013.01); *Y10T 29/49105* (2015.01)

(58) Field of Classification Search
CPC ....... H05K 5/0247; H05K 13/00; H01R 4/64; H01R 29/00; H01R 31/08; Y10T 29/49105
USPC ............ 174/51; 361/1, 42, 220, 437; 307/112
See application file for complete search history.

(56) References Cited

U.S. PATENT DOCUMENTS

| | | | |
|---|---|---|---|
| 3,725,841 | A | 4/1973 | Robinson et al. |
| 5,413,501 | A | 5/1995 | Munn |
| 5,637,000 | A | 6/1997 | Osterbrock et al. |
| 7,154,718 | B1 | 12/2006 | Finlay, Sr. et al. |
| 7,470,145 | B1 | 12/2008 | Savicki, Jr. et al. |
| 7,538,993 | B2 | 5/2009 | Huang et al. |
| 7,576,959 | B2 | 8/2009 | Huang et al. |
| 7,670,155 | B2 | 3/2010 | Ortega |
| 7,713,084 | B1* | 5/2010 | Weeks ............... H01R 13/6658 174/58 |
| 7,940,498 | B2 | 5/2011 | Huang |
| 8,047,883 | B2 | 11/2011 | Montalbano et al. |
| 2005/0002137 | A1* | 1/2005 | Germain ................. H01H 83/04 361/42 |
| 2007/0035898 | A1* | 2/2007 | Baldwin ................ H01H 83/04 361/42 |
| 2009/0032278 | A1* | 2/2009 | Weeks ............... H01R 13/4534 174/53 |

(Continued)

*Primary Examiner* — Timothy Thompson
*Assistant Examiner* — Paul McGee, III
(74) *Attorney, Agent, or Firm* — Kilpatrick Townsend & Stockton, LLP

(57) ABSTRACT

An electrical device is provided that can selectively be powered through a neutral wire or an earth ground. The electrical device includes a line terminal, a neutral terminal, a ground terminal, and a selection mechanism. The line terminal is electrically connected to at least one load. The line terminal can be electrically connected to a line (or "hot") wire. The neutral terminal is electrically connected to the at least one load. The neutral terminal can be electrically connected to the neutral wire. A first electrical path is provided from the line terminal through the at least one load to the neutral terminal. The ground terminal can conduct current to the earth ground. The selection can selectively provide a second electrical path from the neutral terminal to the earth ground via the ground terminal.

17 Claims, 8 Drawing Sheets

(56) References Cited

U.S. PATENT DOCUMENTS

2012/0170342 A1* 7/2012 Manning .................. G06F 1/26
363/146

2013/0188290 A1* 7/2013 Tomimbang ......... H02H 11/002
361/115

* cited by examiner

ELECTRICAL DEVICE POWERED THROUGH NEUTRAL OR GROUND

CROSS-REFERENCE TO RELATED APPLICATIONS

This application claims priority to U.S. Provisional Application Ser. No. 61/602,370 filed Feb. 23, 2012 and titled "Sensor Powered through Neutral or Ground," the contents of which are hereby incorporated by reference.

FIELD OF THE INVENTION

The present invention is directed to powering devices and more particularly relates to devices selectively powered through either a neutral terminal or a ground terminal.

BACKGROUND

The installation of electrical wiring and equipment may be governed by standards adopted by local government that codify requirements for safe electrical installations. For example, a National Electrical Code ("NEC") standard adopted in 2011 specified that field wiring of a building involves running of a neutral wire to a junction box. Jurisdictions implementing the NEC standard adopted in 2011 may require that an electrical device must be powered through a neutral wire if the device has the capability to be powered through the neutral wire. An electrical device can be powered through a neutral wire by connecting a line (or "hot") wire carrying current from a power supply to a first terminal or other conductor of the device (i.e., the line terminal) and connecting a second wire from the power supply to a second terminal or other conductor of the device (i.e., the neutral terminal). Current can flow from hot wire to the line terminal through one or more loads in the device, such as circuitry powered by the current, and to the neutral wire from the neutral terminal.

In buildings or other structures that are not wired in compliance with the 2011 NEC standard, electrical devices can be installed that are powered through ground. An electrical device can be powered through ground by connecting a hot wire from a power supply to the line terminal and connecting a second terminal or other conductor of the device to ground. Current can flow from the line terminal through one or more loads in the device to an earth ground.

Prior solutions for powering devices, such as a sensor, that may be installed according to electrical standards involve powering the device either through a dedicated neutral wire or through a dedicated ground wire or terminal. Powering the device either through a dedicated neutral wire or through a dedicated ground wire or terminal can require an installer of an electrical device to select between a neutral-powered version of the device and a ground-powered version of the device. Requiring the installer to select between a neutral-powered version of the device and a ground-powered version of the device may require the installer to maintain duplicative inventory. An installer erroneously selecting the wrong version of the electrical device for a building may cause installation delays and increased installation costs for electric devices.

It is desirable to provide a single electrical device that is configured for selectively being powered through either a neutral wire or an earth ground.

SUMMARY

In one aspect, an electrical device is provided that is configured for selectively being powered through a neutral wire or an earth ground. The electrical device includes a line terminal, a neutral terminal, a ground terminal, and a selection mechanism. The line terminal is electrically connected to at least one load. The line terminal can be electrically connected to a line wire. The neutral terminal is electrically connected to the at least one load. The neutral terminal can be electrically connected to the neutral wire. A first electrical path is provided from the line terminal through the at least one load to the neutral terminal. The ground terminal can conduct current to the earth ground. The selection can selectively provide a second electrical path from the neutral terminal to the earth ground via the ground terminal.

In another aspect, a method is provided for selectively powering an electrical device through a neutral wire or an earth ground. The method involves providing the electrical device. The electrical device includes a selection mechanism that can selectively provide an electrical path from a neutral terminal of the electrical device to the earth ground via a ground terminal of the electrical device. The method also involves connecting a line wire to a line terminal of the electrical device, wherein the line wire provides current from a power supply. The method also involves configuring the selection mechanism either to provide the electrical path from the neutral terminal to the earth ground via the ground terminal or to allow a flow of current from the line terminal through the neutral terminal to the neutral wire.

These and other aspects, features and advantages of the present invention may be more clearly understood and appreciated from a review of the following detailed description and by reference to the appended drawings and claims.

DETAILED DESCRIPTION

Figure 1:
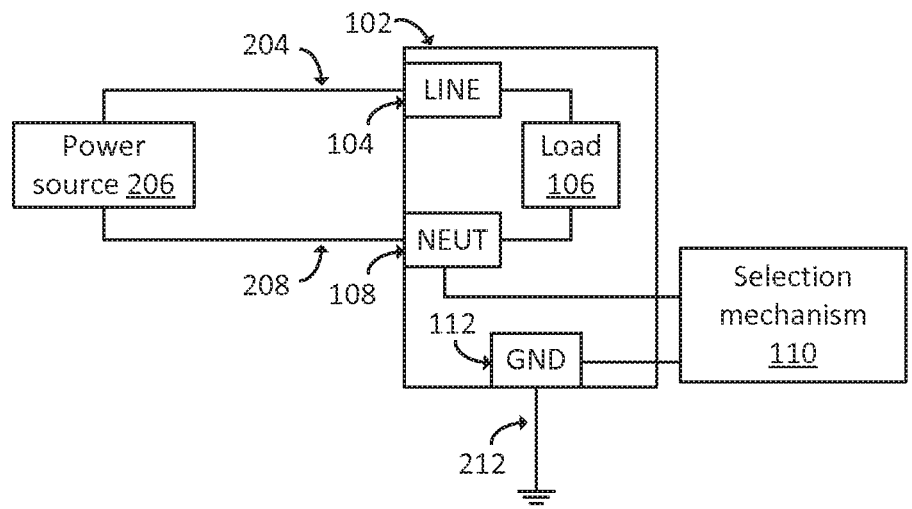
FIG. 1 is a block diagram illustrating an example electrical device that can be selectively powered through a neutral terminal or a ground terminal according to one aspect.

Certain aspects of the present invention provide an electrical device, such as a sensor, that can be powered from neutral or ground. The electrical device includes a line terminal, a neutral terminal, and a ground terminal. The line terminal can be electrically connected to a line (or "hot") wire. The neutral terminal can be electrically connected to a neutral wire that can provide a return path to a power supply for electric current. The ground terminal can conduct current to a ground. A ground can include a reference point in an electrical circuit from which other voltages are measured. In some aspect, the ground can be an earth ground that includes a low impedance path providing a direct physical connection to the Earth. A selection mechanism can selectively provide an electrical path from the neutral terminal to ground via the ground terminal. The electrical device can be powered by electrically connecting the neutral terminal to the ground terminal, thereby forming a short circuit between the neutral terminal and the ground terminal. Non-limiting examples of a selection mechanism can include a removable conductive member for electrically connecting the neutral terminal and the ground terminal, a severable or otherwise removable connecting wire for electrically connecting the neutral terminal and the ground terminal, a switch for selectively providing the electrical path between the neutral terminal and the ground terminal, and the like.

An installer of the electrical device can determine the configuration for the electrical device based on the wiring requirement for a building or other structure in which the electrical device is being installed. For example, the electrical device may be installed in a building that is compliant with standards such as the 2011 National Electrical Code ("NEC") wiring standard. An installer can configure the electrical device to remove the electrical path from the neutral terminal to the ground terminal, thereby allowing the electrical device to be powered through the neutral terminal. In another example, the electrical device may be installed in a building that is not compliant with the 2011 NEC and therefore allows electrical devices to be powered through ground. The installer can configure the electrical device to provide the electrical path from the neutral terminal to the ground terminal, thereby allowing the electrical device to be powered through the ground terminal. Thus, an electrical device according to certain aspects disclosed herein can obviate the need for an installer to maintain inventories of electrical devices powered through neutral and electrical devices powered through ground.

Detailed descriptions of certain aspects and examples are discussed below. These illustrative examples are given to introduce the reader to the general subject matter discussed here and are not intended to limit the scope of the disclosed concepts. The following sections describe various additional aspects and examples with reference to the drawings in which like numerals indicate like elements, and directional descriptions are used to describe the illustrative examples hut, like the illustrative embodiment examples, should not be used to limit the present invention.

FIG. 1 is a block diagram illustrating an electrical device 102 that can be selectively powered through a neutral terminal 108 or a ground terminal 112. Non-limiting examples of an electrical device 102 include (but are not limited to) sensors, timers, and dimmers. The electrical device 102 can include a line terminal 104, at least one load 106, a neutral terminal 108, a selection mechanism 110, and a ground terminal 112. The line terminal 104 can be connected to a "hot" wire from a power supply or other power source. The load 106 can include one or more components of the electrical device 102 that receive power via the line terminal 104. For example, the load 106 can include sensing circuitry, timing circuitry, dimming circuitry, etc. The neutral terminal 108 can be connected to a neutral wire from a power supply or other power source. The ground terminal 112 can be connected to an earth ground. The selection mechanism 110 can include any device, structure, or component that selectively provides an electrical path between the neutral terminal 108 and the ground terminal 112 such that the electrical device 102 is powered either through neutral or ground.

As depicted in FIG. 1, a hot wire 204 can be connected from a power source 206 to the line terminal 104. A non-limiting example of a power source 206 is an alternating current ("AC") voltage source. In some aspects, the hot wire 204 can include an insulator having a color specified by a wiring standard. For example, the hot wire 204 can have a red or black insulator. A neutral wire 208 can be connected from the power source 206 to the neutral terminal 108. In some aspects, the neutral wire 208 can include an insulator having a color specified by a wiring standard. For example, the neutral wire 208 can have a white insulator as specified by an NEC-based standard. The selection mechanism 110 can provide an electrical path from the neutral terminal 108 to the ground terminal 112. A ground wire 212 can be connected from the ground terminal 112 to ground. In some aspects, the ground wire 212 can include an insulator having a color specified by a wiring standard. For example, the ground wire 212 can have a green insulator as specified by an NEC-based standard.

Figure 2:
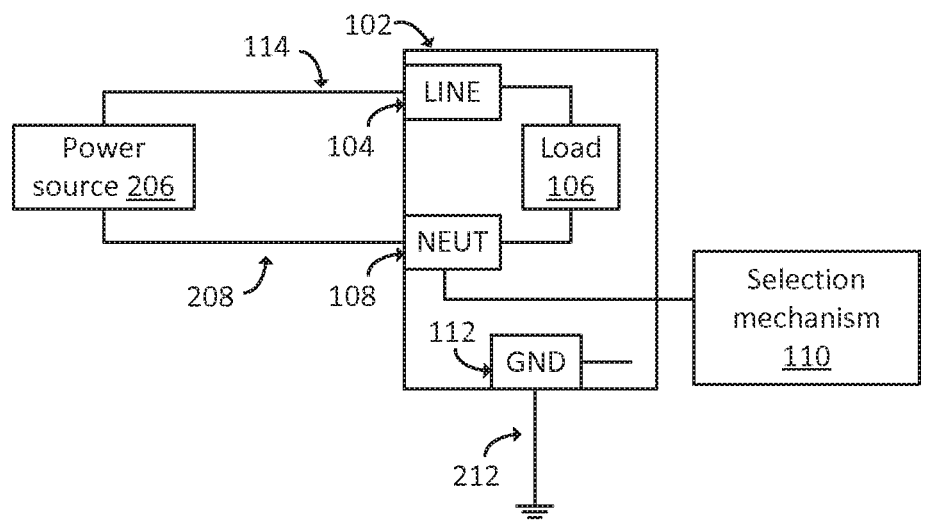
FIG. 2 is a block diagram illustrating the electrical device being selectively powered through the neutral terminal according to one aspect.

FIG. 2 is a block diagram illustrating the electrical device 102 being selectively powered through the neutral terminal 108. The selection mechanism 110 can be configured such that the electrical path between the neutral terminal 108 and the ground terminal 112 is broken or otherwise removed.

Figure 3:
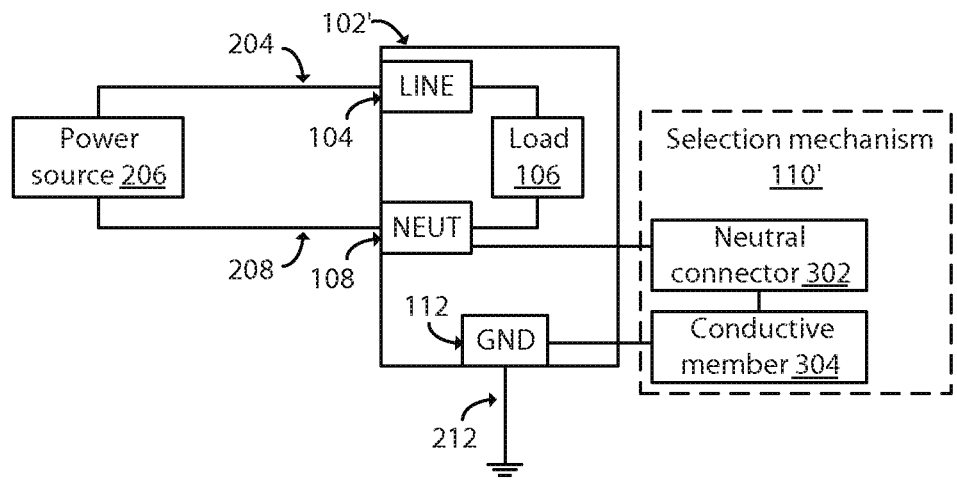
FIG. 3 is a perspective view illustrating an example electrical device powered through a ground terminal via a conductive member that is selectively coupled to a neutral connector according to one aspect.

In some aspects, the selection mechanism 110 can include a removable conductor for connecting the neutral terminal 108 to the ground terminal 110. For example, FIG. 3 is a block diagram illustrating an electrical device 102 being powered through the ground terminal 112 via a conductive member 304 that is selectively coupled to a neutral connector 302. The selection mechanism 110' can include the neutral connector 302 and the conductive member 304. The neutral connector 302 can provide an electrical connection to the neutral terminal 108 of the electrical device 102'. The conductive member 304 can provide an electrical path between the neutral connector 302 and the ground terminal 112.

Figure 4:
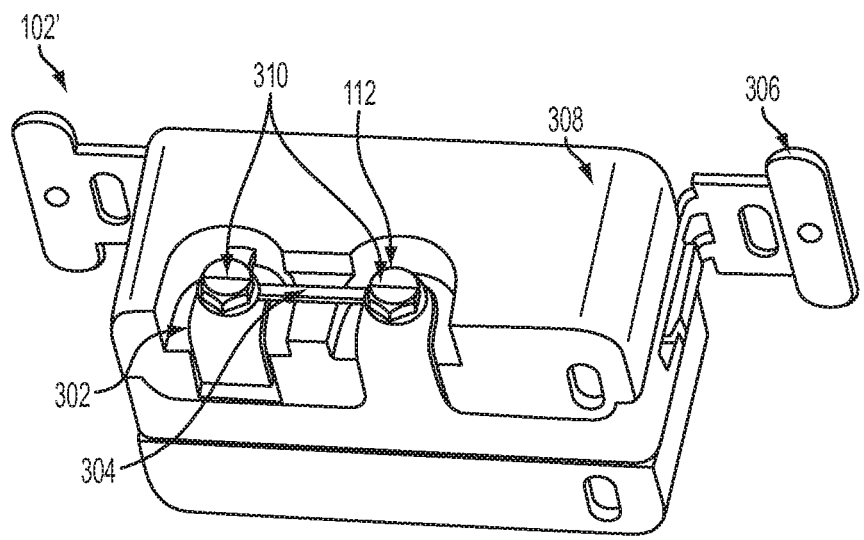
FIG. 4 is a perspective view illustrating the electrical device configured for being powered through the ground terminal via the conductive member coupled to the neutral connector according to one aspect.

FIG. 4 is a perspective view illustrating the electrical device 102' that can be powered through the ground terminal 112 via the neutral connector 302 and the conductive member 304. The electrical device 102' can include a body 308 in which the load 106 can be disposed. The body 308 can be formed from a non-conductive material. The conductive member 304 can be coupled to the neutral connector 302 via screws 310 or any other suitable fastening device. The ground terminal 112 can be electrically connected to an earth ground via a grounding strap 306. Each of the neutral connector 302, the conductive member 304, and the grounding strap 306 can be formed from any suitable conductive material, such as metal.

Figure 5:
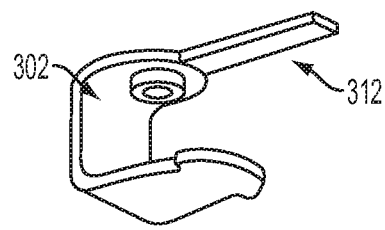
FIG. 5 is a perspective view illustrating an example neutral connector according to one aspect.
Figure 6:
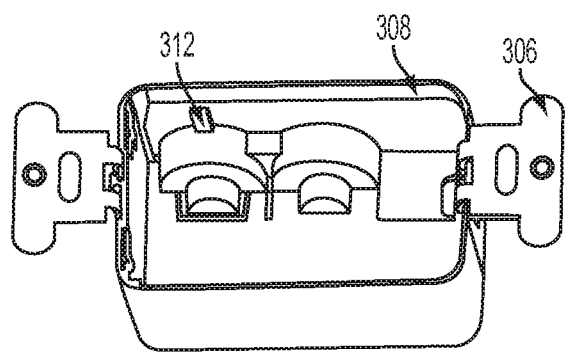
FIG. 6 is a perspective view illustrating the neutral connector disposed in the body of the electrical device according to one aspect.

FIG. 5 is a perspective view illustrating an example neutral connector 302. The neutral connector 302 can include a tab 312. The neutral connector 302 can be positioned in a body 308 of the electrical device 102' such that the tab 312 is inserted through a slot or other opening in the body 308, as depicted in the perspective view of FIG. 6. The tab 312 can contact the neutral terminal 108 of the electrical device 102'. The tab 312 contacting the neutral terminal 108 can provide an electrical path through the neutral terminal 108, the neutral connector 302, the conductive member 304, and the ground terminal 112.

Figure 7:
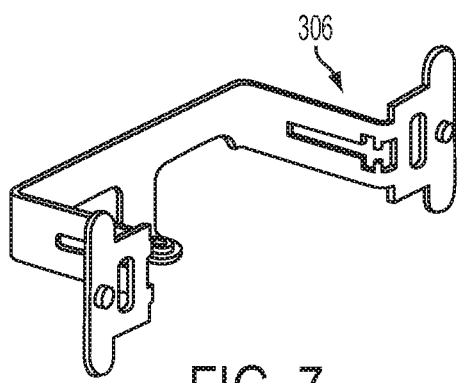
FIG. 7 is a perspective view illustrating an example grounding strap of the electrical device according to one aspect.

FIG. 7 is a perspective view illustrating an example grounding strap 306 of the electrical device 102'. In some aspects, the grounding strap 306 can be a separate component that is coupled or otherwise attached to the body 308 of the electrical device 102'. In other aspects, the grounding strap 306 can be integrally formed with the body 308 of the electrical device 102'. During installation, a ground wire can be connected to an appropriate point on the electrical device 102, such as the ground terminal 112 or the grounding strap 306.

Figure 8:
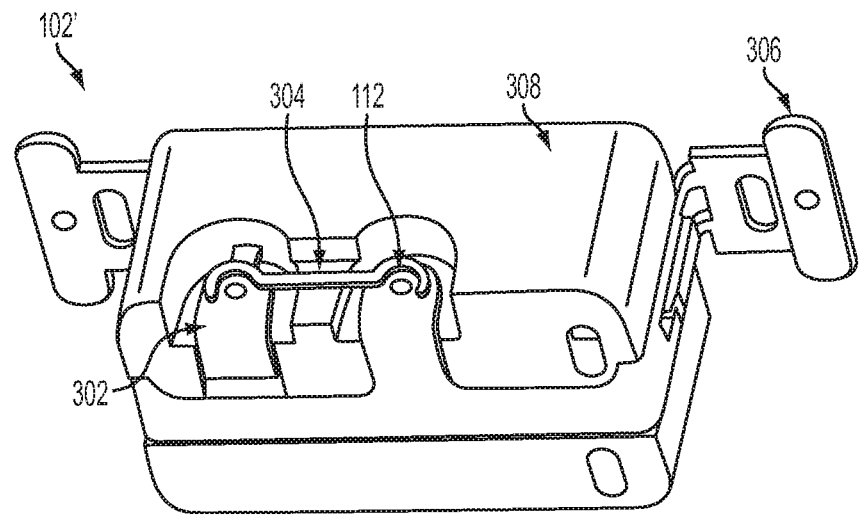
FIG. 8 is a perspective view illustrating the electrical device being powered through a neutral wire by removing the conductive member according to one aspect.
Figure 9:
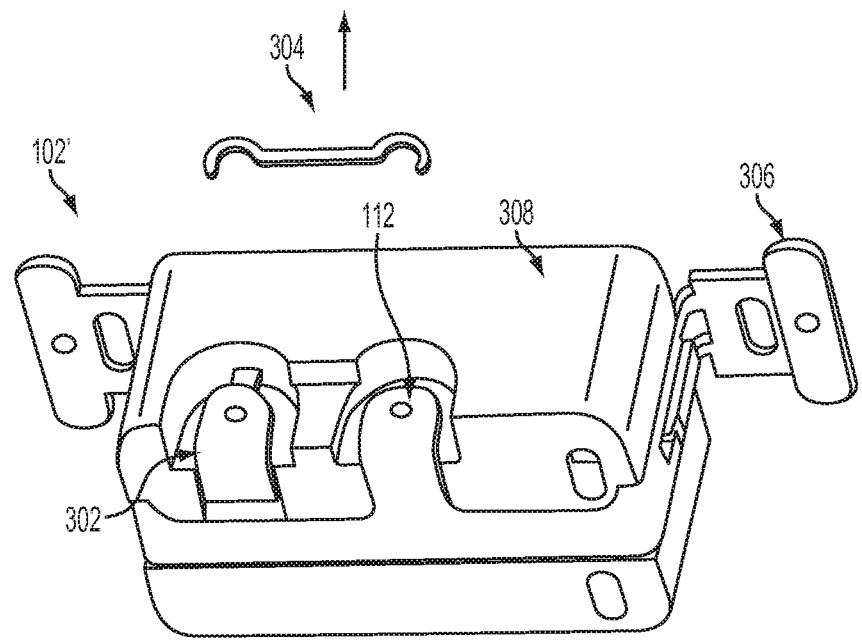
FIG. 9 is a perspective view illustrating the electrical device being powered through a neutral wire by removing the conductive member according to one aspect.

The electrical device 102' can be powered through the neutral terminal 108 by removing the conductive member 304. Removing the conductive member 304 removes an electrical path between the neutral terminal 108 and the ground terminal 112. As depicted in FIG. 8, the screws 310 can be removed to allow the conductive member 304 to be removed. The upward arrow in FIG. 9 depicts the removal of the conductive member 304 from the electrical device 102'.

Figure 10:
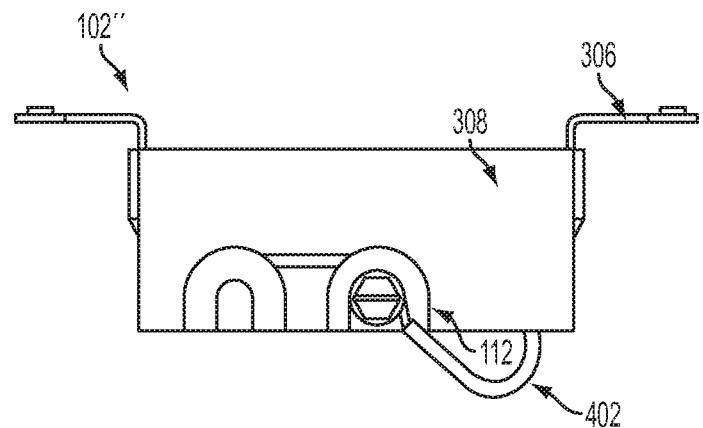
FIG. 10 is a vertical view illustrating an electrical device being powered through a ground terminal via a neutral connection wire according to one aspect.

In other aspects, the selection mechanism can include a connection wire for connecting the neutral terminal 108 to the ground terminal 110. For example, FIG. 10 is a vertical view of an electrical device 102" being powered through a ground terminal 112 via a neutral connection wire 402. In some aspects, the neutral connection wire 402 can be connected or otherwise coupled to the ground terminal 110 during manufacturing. The neutral connection wire 402 can run from the neutral terminal 108 within the body 308 of the electrical device 102" to the ground terminal 112. The ground terminal 112 can be connected to the grounding strap 306.

In some aspects, the neutral connection wire 402 can include an insulator having a color specified by a wiring standard. For example, the neutral connection wire 402 can have a white insulator as specified by an NEC-based standard.

The neutral connection wire 402 can provide an electrical path from the neutral terminal 108 to the ground terminal 112. The electrical path from the neutral terminal 108 to the ground terminal 112 can cause the electrical device 102" to be powered through the ground terminal 112.

Figure 11:
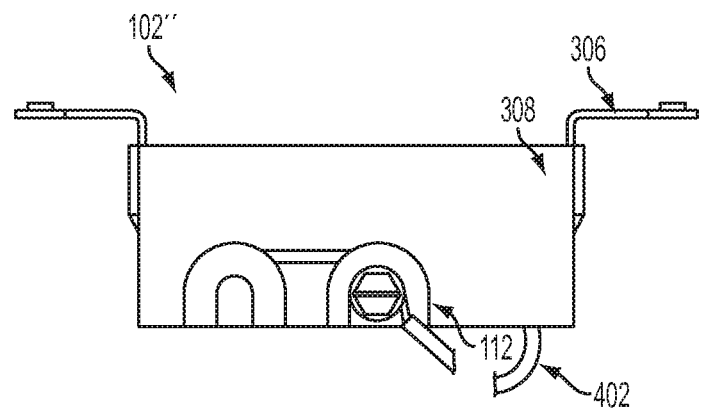
FIG. 11 is a vertical view illustrating the electrical device being powered through a neutral terminal by severing the neutral connection wire according to one aspect.
Figure 12:
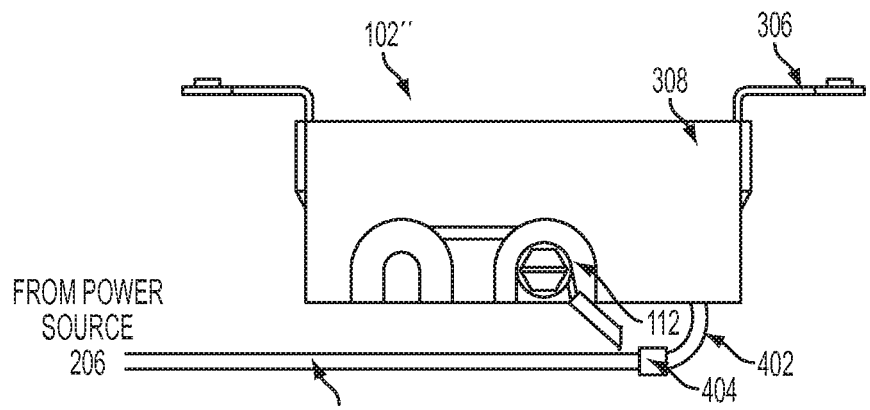
FIG. 12 is a vertical view illustrating the electrical device being powered through the neutral terminal by connecting a neutral wire to the severed neutral connection wire according to one aspect.

The electrical device 102" can be powered through the neutral terminal 108 by severing or otherwise disconnecting the neutral connection wire 402 from the ground terminal 112. For example, as depicted in FIG. 11, the neutral connection wire 402 can be severed, thereby breaking the electrical path between the neutral terminal 108 and the ground terminal 112. In some aspects, the neutral wire 208 can be connected to the severed or otherwise disconnected neutral connection wire 408 via a connector 404, as depicted in FIG. 12.

Figure 13:
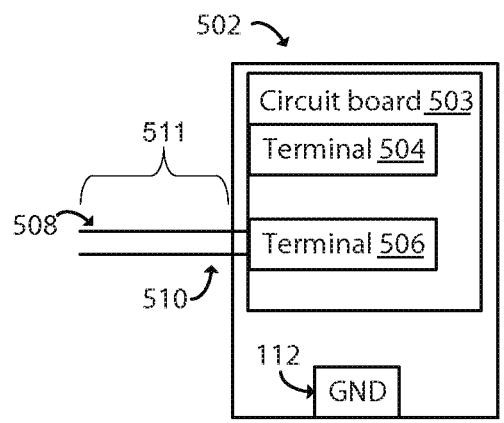
FIG. 13 is a block diagram illustrating an example electrical device that can be selectively powered through a neutral terminal via a neutral connection wire or through a ground terminal via a ground connection wire according to one aspect.

In additional or alternative aspects, an electrical device can include a circuit board with multiple connecting wires for connecting a terminal of the circuit board to either a neutral wire or a ground terminal. For example, FIG. 13 is a block diagram illustrating an example electrical device 502 that can include a circuit board 503 that is selectively powered through either a neutral connection wire 508 or a ground connection wire 510. The circuit board 503 can include terminals 504, 506. The terminal 504 can be connected to a hot wire. The terminal 506 can be connected either to a neutral wire via the neutral connection wire 508 or to ground via the ground connection wire 510. The selection mechanism 511 of the electrical device 502 can include the neutral connection wire 508 and the ground connection wire 510 connected to the terminal 506. The neutral connection wire 508 and the ground connection wire 510 can be connected or otherwise coupled to the terminal 506 during manufacturing. Non-limiting examples of the terminals 504, 506 include input/output pins of the circuit board 503. Although FIG. 13 depicts the circuit board 503 as having only two terminals, a circuit board of an electrical device can include any number of terminals.

Figure 14:
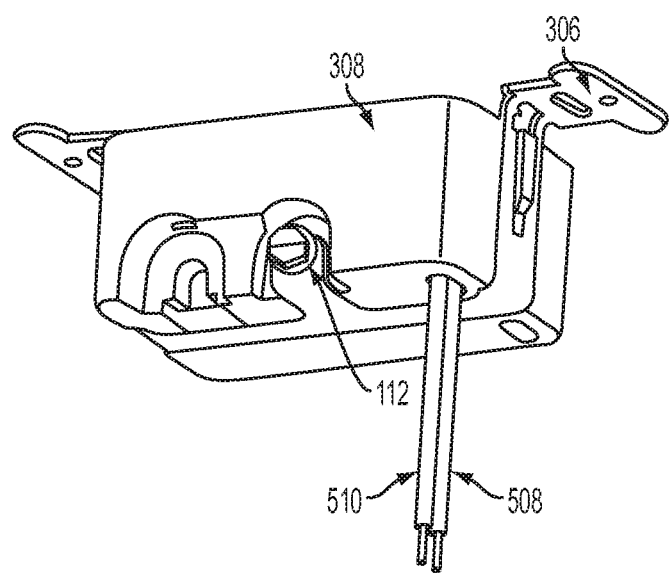
FIG. 14 is a perspective view illustrating the electrical device that can be selectively powered through a neutral terminal via a neutral connection wire or through a ground terminal via a ground connection wire according to one aspect.

FIG. 14 is a perspective view illustrating an example electrical device 502. The neutral connection wire 508 and the ground connection wire 510 can be run through a slot or other opening in the body 308 of the electrical device 502. In some aspects, the neutral connection wire 508 and the ground connection wire 510 can respectively include insulators having different colors as specified by a wiring standard. For example, the neutral connection wire 508 can have a white insulator as specified by an NEC-based standard and the ground connection wire 510 can have a green insulator as specified by an NEC-based standard.

Figure 15:
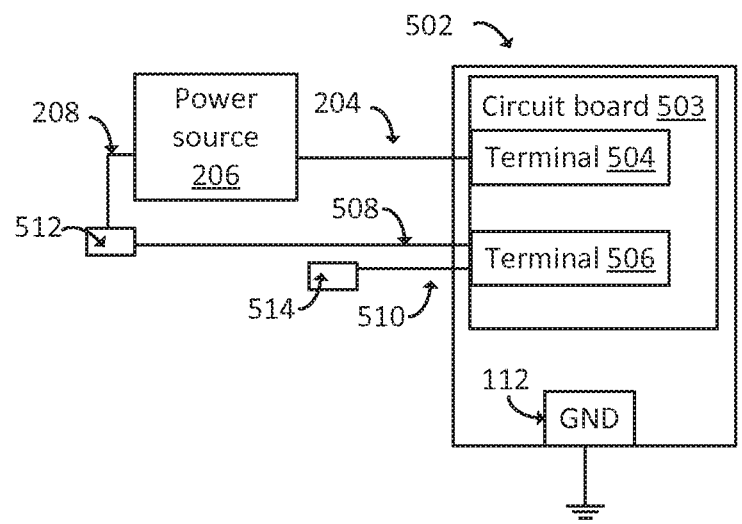
FIG. 15 is a block diagram illustrating the electrical device being powered through the neutral connection wire according to one aspect.

FIG. 15 is a block diagram illustrating the electrical device being powered through the neutral connection wire 508. The neutral wire 208 can be connected from the power source 206 to the neutral connection wire 508 via a connector 512. The ground connection wire 510 can be terminated by a terminator 514.

Figure 16:
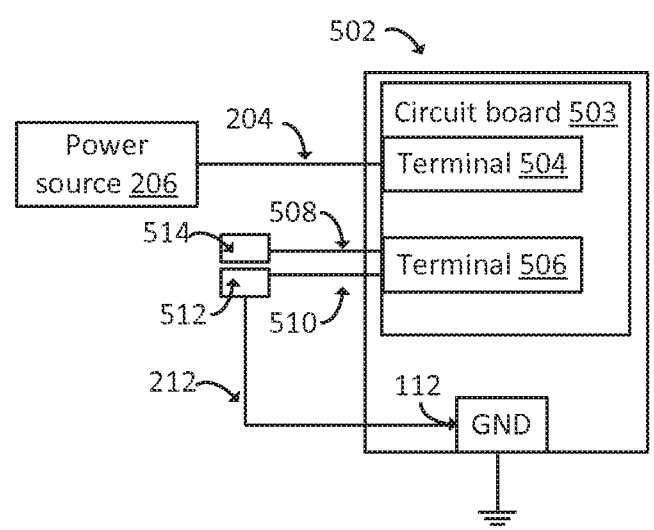
FIG. 16 is a block diagram illustrating the electrical device being powered through the ground connection wire according to one aspect.

FIG. 16 is a block diagram illustrating the electrical device being powered through the ground connection wire 510. A ground wire 212 can be connected from the ground terminal 112 or the grounding strap 306 to the ground connection wire 510 via a connector 512. The neutral connection wire 508 can be terminated by the terminator 514.

Although FIGS. 15-16 depict either the neutral connection wire 508 or the ground connection wire 510 being terminated by the terminator 514, other implementations are possible. In some aspects, the electrical device 502 can be manufactured such that any conductive material of the neutral connection wire 508 and the ground connection wire 510 outside the body 308 is surrounded by an appropriate insulator. During installation of the electrical device 502, insulation for either the neutral connection wire 508 or the ground connection wire 510 can be at least partially removed to expose conductive material of the selected connecting wire for connection either to the neutral wire 208 or to ground.

Figure 17:
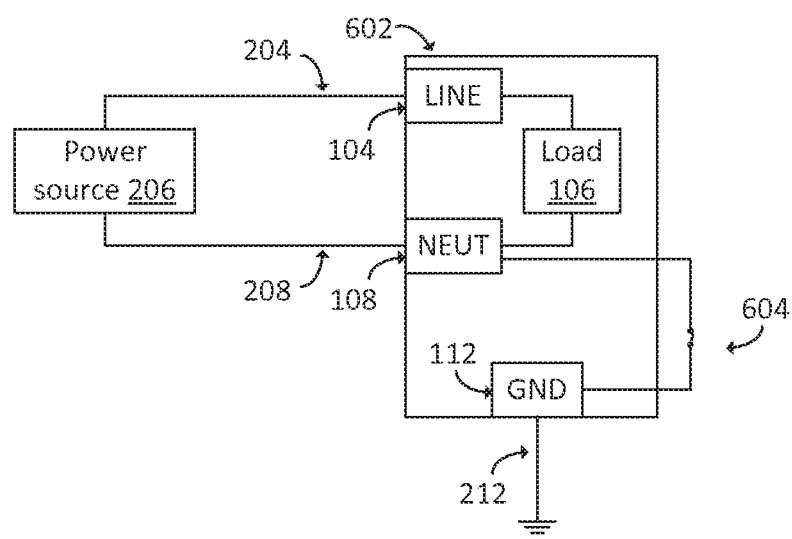
FIG. 17 is a block diagram illustrating an electrical device that includes a switch for selectively powering the electrical device through a neutral terminal or a ground terminal.

In additional or alternative aspects, a selection mechanism can include a switch. For example, FIG. 17 is a block diagram illustrating an electrical device 602 being selectively powered through the neutral terminal 108 or the ground terminal 112 via a switch 604. The electrical device 602 can be powered through the neutral terminal 108 by setting the switch 604 to an open position. The electrical device 602 can be powered through the ground terminal 112 by setting the switch 604 to a closed position.

The foregoing description, including illustrated examples, of the invention has been presented only for the purpose of illustration and description and is not intended to be exhaustive or to limit the invention to the precise forms disclosed. Numerous modifications, adaptations, and uses thereof will be apparent to those skilled in the art without departing from the scope of this invention. Aspects and features from each example disclosed can be combined with aspects and features from any other example.

What is claimed is:

1. An electrical device configured for selectively being powered through a neutral wire or an earth ground, the electrical device comprising:
   a line terminal electrically connected to at least one load and configured to be electrically connected to a line wire for receiving current from a power supply;
   a neutral terminal electrically connected to the at least one load and configured to be electrically connected to the neutral wire, wherein a first electrical path is provided from the line terminal through the at least one load to the neutral terminal;
   a ground terminal configured to selectively conduct current to the earth ground; and
   a selection mechanism configured to selectively provide a second electrical path from the neutral terminal to the earth ground via the ground terminal.

2. The electrical device of claim 1, wherein the selection mechanism comprises a conductive member coupled to the ground terminal via a removable fastening device, wherein the second electrical path includes the neutral terminal electrically connected to the ground terminal via the conductive member.

3. The electrical device of claim 2, wherein the selection mechanism further comprises a neutral connector device electrically connected to the neutral terminal and coupled to the conductive member via an additional removable fastening device, wherein the second electrical path includes the neutral connector device and the conductive member.

4. The electrical device of claim 2, further comprising a conductive grounding strap electrically connected to the ground terminal, wherein the conductive grounding strap is adapted to provide a ground path to the earth ground.

5. The electrical device of claim 1, wherein the selection mechanism comprises a neutral connection wire coupled to the ground terminal and to the neutral terminal, wherein the second electrical path includes the neutral terminal electrically connected to the ground terminal via the neutral connection wire.

6. The electrical device of claim 5, wherein the neutral connection wire is adapted to be disconnected from the ground terminal and to be electrically connected to the neutral wire.

7. The electrical device of claim 1, further comprising a circuit board, wherein the line terminal is a first input/output pin of the circuit board and wherein the neutral terminal is a second input/output pin of the circuit board, wherein the selection mechanism comprises:
   a ground connection wire electrically connected to the neutral terminal and configured to be electrically connected to the ground terminal; and
   a neutral connection wire electrically connected to the neutral terminal and configured to be electrically connected to the neutral wire.

8. The electrical device of claim 1, wherein the selection mechanism comprises a switch electrically connected to the neutral terminal and to the ground terminal, wherein the switch is adapted to be set to a closed position providing the second electrical path and to be set to an open position removing the second electrical path.

9. The electrical device of claim 1, wherein the at least one load comprises sensor circuitry.

10. A method for selectively powering an electrical device through a neutral wire or an earth ground, the method comprising:
    providing the electrical device, wherein the electrical device comprises a selection mechanism configured to selectively provide an electrical path from a neutral terminal of the electrical device to the earth ground via a ground terminal of the electrical device;
    connecting a line wire to a line terminal of the electrical device, wherein the line wire provides current from a power supply; and
    configuring the selection mechanism to either provide the electrical path from the neutral terminal to the earth ground via the ground terminal or to allow a flow of current from the line terminal through the neutral terminal to the neutral wire.

11. The method of claim 10,
    wherein the selection mechanism comprises a conductive member;
    wherein configuring the selection mechanism to provide the electrical path comprises coupling the conductive member to the ground terminal;
    wherein configuring the selection mechanism to allow the flow of current from the line terminal through the neutral terminal to the neutral wire comprises removing the conductive member from the ground terminal.

12. The method of claim 11, wherein configuring the selection mechanism to provide the electrical path further comprises coupling the conductive member to a neutral connector device electrically connected to the neutral terminal.

13. The method of claim 11, further comprising connecting a conductive grounding strap to the ground terminal.

14. The method of claim 10,
    wherein the selection mechanism comprises a neutral connection wire;
    wherein configuring the selection mechanism to provide the electrical path comprises connecting the neutral connection wire to the ground terminal and to the neutral terminal;
    wherein configuring the selection mechanism to allow the flow of current from the line terminal through the neutral terminal to the neutral wire comprises severing the neutral connection wire.

15. The method of claim 14, wherein configuring the selection mechanism to allow the flow of current from the line terminal through the neutral terminal to the neutral wire further comprises connecting the neutral connection wire to the neutral wire.

16. The method of claim 10,
    wherein the selection mechanism comprises a ground connection wire electrically connected to the neutral terminal and a neutral connection wire electrically connected to the neutral terminal;
    wherein configuring the selection mechanism to provide the electrical path comprises connecting the ground connection wire to the ground terminal;

wherein configuring the selection mechanism to allow the flow of current from the line terminal through the neutral terminal to the neutral wire comprises connecting the neutral connection wire to the neutral terminal.

17. The method of claim 10,
wherein the selection mechanism comprises a switch electrically connected to the neutral terminal and to the ground terminal,
wherein configuring the selection mechanism to provide the electrical path comprises setting the switch to a closed position;
wherein configuring the selection mechanism to allow the flow of current from the line terminal through the neutral terminal to the neutral wire comprises setting the switch to an open position.

* * * * *